United States Patent
Shin et al.

(10) Patent No.: US 7,482,747 B2
(45) Date of Patent: Jan. 27, 2009

(54) FLEXIBLE EL DEVICE

(75) Inventors: Dong Hyuk Shin, Seoul (KR); Kwang Hyuk Bae, Daejeon (KR)

(73) Assignee: ELK Corporation, Yuseong-Gu (KR)

( * ) Notice: Subject to any disclaimer, the term of this patent is extended or adjusted under 35 U.S.C. 154(b) by 0 days.

(21) Appl. No.: 11/628,642

(22) PCT Filed: Mar. 14, 2005

(86) PCT No.: PCT/KR2005/000721

§ 371 (c)(1),
(2), (4) Date: Dec. 6, 2006

(87) PCT Pub. No.: WO2005/122643

PCT Pub. Date: Dec. 22, 2005

(65) Prior Publication Data

US 2008/0012483 A1    Jan. 17, 2008

(30) Foreign Application Priority Data

Jun. 14, 2004    (KR) ................ 10-2004-0043546

(51) Int. Cl.
*H05B 33/00*    (2006.01)
(52) U.S. Cl. .................. 313/506; 313/504; 428/917
(58) Field of Classification Search .......... 313/504, 313/506, 512
See application file for complete search history.

(56) References Cited

U.S. PATENT DOCUMENTS

| 4,593,228 A | * | 6/1986 | Albrechtson et al. ........ 313/509 |
| 6,521,359 B1 | | 2/2003 | Noguchi et al. |
| 7,202,600 B2 | * | 4/2007 | Zovko et al. ................. 313/506 |

FOREIGN PATENT DOCUMENTS

| JP | A 10-321369 | 12/1998 |
| JP | A 2000-012213 | 1/2000 |

* cited by examiner

*Primary Examiner*—Ashok Patel
(74) *Attorney, Agent, or Firm*—Oliff & Berridge, PLC

(57) ABSTRACT

A flexible EL device comprises a substrate, which is made of highly polymerized synthetic rubber, polyurethane, or silicon rubber, a conductive layer, a dielectric layer, a fluorescent layer, a transparent conductive layer, and a polymer protection film layer. Due to the high flexibility of the substrate, the flexibility of the flexible EL device according to the present invention is higher than the conventional EL device using PET, and therefore, the durability of the flexible EL device under mechanical impact is improved. As a result, the flexible EL device is not damaged when physical impacts are applied to the flexible EL device. Furthermore, noise is prevented or reduced by simply changing the structure of the flexible EL device and adding material layers, and therefore, electric and physical properties of the flexible EL device are improved. The flexible EL device is applicable to EL dome sheets or EL keypads.

10 Claims, 2 Drawing Sheets

FLEXIBLE EL DEVICE

TECHNICAL FIELD

The present invention relates to a flexible EL (electroluminescence) device, and, more particularly, to a flexible EL device using a flexible substrate.

BACKGROUND ART

A conventional EL device uses a PET film coated with ITO as a substrate. However, the PET has poor flexibility with the result that the flexibility of an EL device having the PET substrate is very low. Consequently, when the EL device is folded or bent, the ITO is damaged, and therefore, light emitting patterns are damaged. In the worst case, spots may be formed.

DISCLOSURE

[Technical Problem]

Therefore, the present invention has been made in view of the above problems, and it is an object of the present invention to provide a flexible EL device having improved flexibility.

[Technical Solution]

In accordance with one aspect of the present invention, the above and other objects can be accomplished by the provision of a flexible EL device comprising: a substrate made of highly polymerized synthetic rubber, polyurethane, or silicon rubber; a conductive layer formed on the substrate; a dielectric layer formed on the conductive layer; a phosphor layer formed on the dielectric layer; a transparent conductive layer formed on the phosphor layer; and a polymer protection layer formed on the transparent conductive layer.

Preferably, the flexible EL device further comprises: a polymer layer disposed between the substrate and the conductive layer.

Preferably, the flexible EL device further comprises: a polymer insulation layer and a second conductive layer disposed between the conductive layer and the dielectric layer, the second conductive layer being formed on the polymer insulation layer.

In accordance with another aspect of the present invention, there is provided a flexible EL device comprising: a transparent or translucent substrate made of highly polymerized synthetic rubber, polyurethane, or silicon rubber; a transparent conductive layer formed on the substrate; a phosphor layer formed on the transparent conductive layer; a dielectric layer formed on the phosphor layer; a conductive layer formed on the dielectric layer; and a polymer protection layer formed on the conductive layer.

Preferably, the flexible EL device further comprises: a polymer layer disposed between the substrate and the transparent conductive layer.

Preferably, the flexible EL device further comprises: a second conductive layer and a polymer insulation layer disposed between the dielectric layer and the conductive layer, the polymer insulation layer being formed on the second conductive layer.

[Advantageous Effects]

According to the present invention with the above-stated construction, the substrate of the flexible EL device is made of highly polymerized synthetic rubber, polyurethane, or silicon rubber, and therefore, the substrate is very flexible. Consequently, the flexibility of the flexible EL device according to the present invention is higher than the conventional EL device using PET, and therefore, the durability of the flexible EL device according to the present invention is improved. As a result, the flexible EL device is not damaged even when hundreds of thousands of physical impacts are applied to the flexible EL device.

Furthermore, noise is effectively prevented by simply changing the structure of the flexible EL device and adding material layers, and therefore, electric and physical properties of the flexible EL device are improved.

In addition, the flexible EL device according to the present invention is applicable to EL dome sheets or EL keypads.

DESCRIPTION OF DRAWINGS

The above and other objects, features and other advantages of the present invention will be more clearly understood from the following detailed description taken in conjunction with the accompanying drawings, in which.

BEST MODE

Now, preferred embodiments of the present invention will be described in detail with reference to the accompanying drawings.

Figure 1:
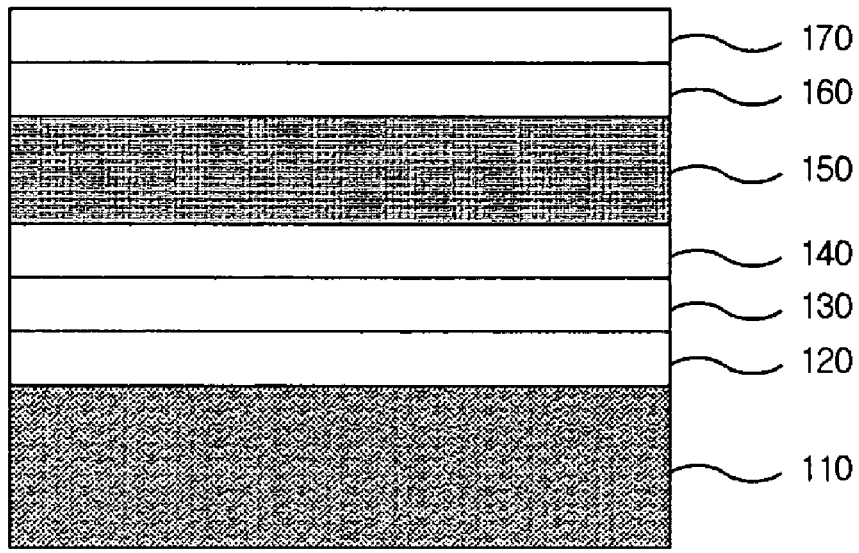
FIGS. 1 to 3 are views schematically showing flexible EL devices according to preferred embodiments of the present invention.
Figure 2:
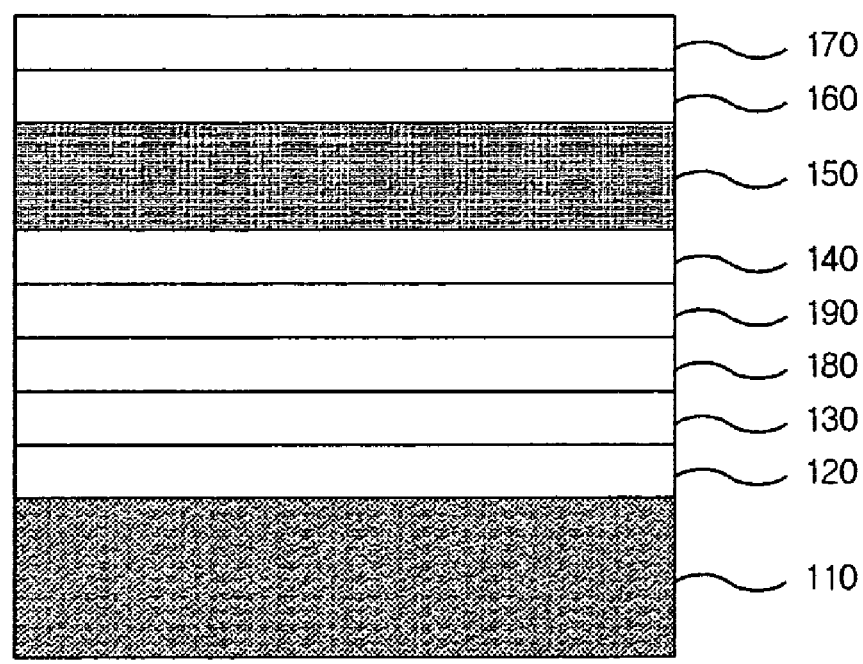
Figure 3:
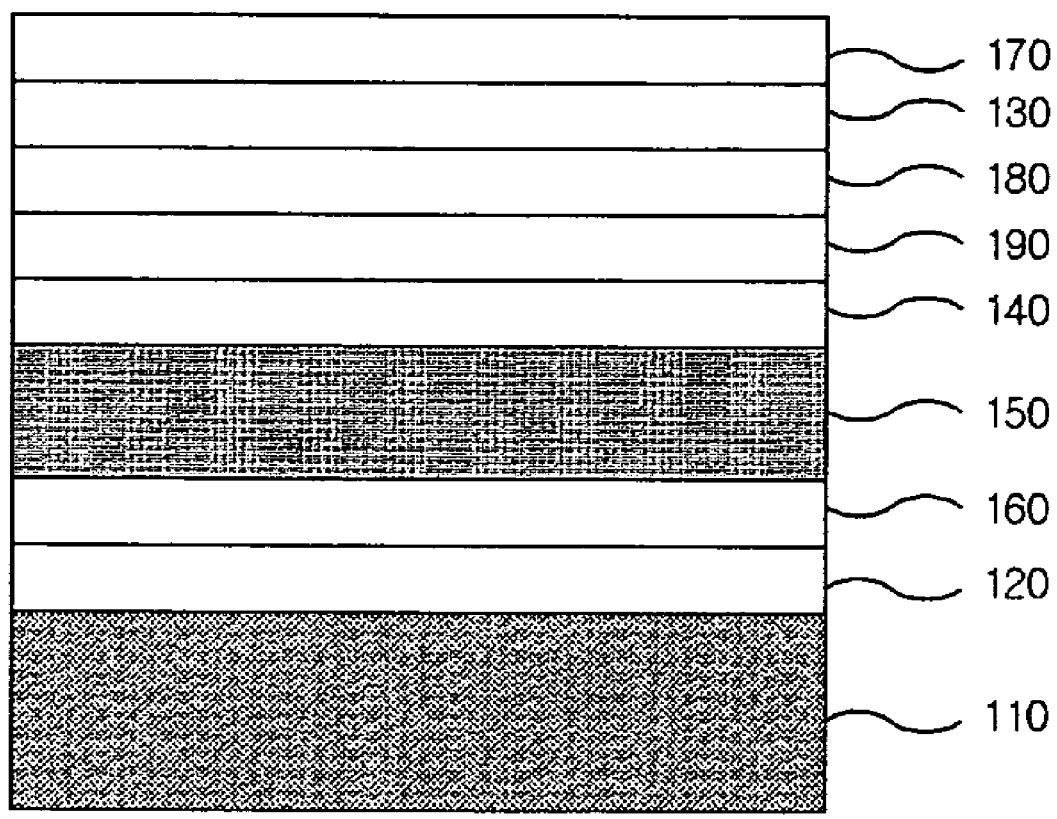

FIGS. 1 to 3 are views schematically showing flexible EL devices according to preferred embodiments of the present invention.

EMBODIMENT 1

Referring to FIG. 1, a flexible EL device according to a first preferred embodiment of the present invention comprises: a substrate 110 having a thickness of 0.05 to 2.00 mm; a polymer layer 120 formed on the substrate 110, the polymer layer having a thickness of 5 to 50 μm; a conductive layer 130 formed on the polymer layer 120, the conductive layer having a thickness of 5 to 20 μm; a dielectric layer 140 formed on the conductive layer 130, the dielectric layer having a thickness of 3 to 25 μm; a phosphor layer 150 formed on the dielectric layer 140, the phosphor layer having a thickness of 30 to 50 μm; a transparent conductive layer 160 formed on the phosphor layer 150, the transparent conductive layer having a thickness of 1 to 10 μm; and a polymer protection film layer 170 formed on the transparent conductive layer 160, the polymer protection film layer having a thickness of 5 to 50 μm. The polymer layer 120 is provided to prevent permeation of moisture, and therefore, the polymer layer 120 is not an essential component of the present invention. The polymer layer 120 may be optionally used based on the characteristics of the substrate 110.

The total thickness of the flexible EL device is preferably set to 0.08 to 1.2 mm such that the flexible EL device maintains its flexibility.

The respective material layers used in the flexible EL device according to the first preferred embodiment of the present invention are formed on the substrate by screen printing once or several times. Materials used for the substrate and the respective material layers are as follows.

As the material for the substrate 110, highly polymerized synthetic rubber, polyurethane, or silicon rubber may be used. Preferably, the highly polymerized synthetic rubber, which is more flexible than the polyurethane or the silicon rubber, is used as the material for the substrate.

It is required that the polymer layer 120 effectively prevent permeation of moisture after the polymer layer is dried, and the polymer layer be securely adhered to the substrate made of the highly polymerized synthetic rubber. Consequently, binder made of fluoroelastomeric polymer resin or polyurethane, or polymer hardened by infrared (IR) or ultraviolet (UV) irradiation may be used as the material for the polymer layer.

The conductive layer 130 is composed of a mixture of conductive powder dispersed in binder, conductive organic polymer, or a mixture of conductive powder and conductive organic polymer. As the conductive powder, for example, carbon powder, silver powder, copper powder, or copper powder coated with silver, may be used. As the conductive organic polymer, for example, 3,4-ethylenedioxythiophene (PEDOT: PSS) or polyethylenedioxythiophene (PEDOT:PSS) may be used.

The dielectric layer 140 is composed of dielectric powder and binder. As the dielectric powder, dielectric powder having a high dielectric constant, such as $BaTiO_3$, may be used. The size of the dielectric powder is 0.1 to 10 μm. As the binder of the dielectric layer, polymer having a high dielectric constant, such as cyanoethyl pullulan or fluororesin, may be used.

The phosphor layer 150 is composed of phosphor powder and binder. As the phosphor powder, Group II to Group IV compounds, such as ZnS, may be used. Preferably, the binder used in the phosphor layer has a dielectric constant higher than that of the phosphor powder. As the binder having the high dielectric constant, cyanoethyl pullulan or fluororesin may be used. Fluorescent paints or fluorescent dyes, such as rhodamine, may be mixed with the binder of the phosphor layer to change illuminating colors of the device.

The transparent conductive layer 160 may be composed of a compound of ITO powder and binder, an ITO layer formed by sputtering, conductive organic polymer, or a compound of conductive organic polymer and ITO. As the conductive organic polymer, for example, 3,4-ethylenedioxythiophene (PEDOT:PSS) or polyethylenedioxythiophene (PEDOT: PSS) may be used.

According to the first preferred embodiment of the present invention, the highly polymerized synthetic rubber, polyurethane, or silicon rubber, which has excellent flexibility, is used as the material for the substrate. Consequently, the flexibility of the flexible EL device according to the present invention is higher than that of the conventional EL device using PET, and therefore, the flexible EL device according to the present invention has excellent resistance against physical impacts.

EMBODIMENT 2

A flexible EL device according to a second preferred embodiment of the present invention is similar to the flexible EL device according to the first preferred embodiment of the present invention except that the flexible EL device according to the second preferred embodiment of the present invention further comprises a three-layered structure for reducing noise of the flexible EL device. Consequently, descriptions of the components of the flexible EL device according to the second preferred embodiment of the present invention corresponding to those of the flexible EL device according to the first preferred embodiment of the present invention will not be given.

Referring to FIG. 2, the flexible EL device according to the second preferred embodiment of the present invention comprises: a substrate 110 made of highly polymerized synthetic rubber, polyurethane, or silicon rubber, the substrate having a thickness of 0.05 to 2.00 mm; a polymer layer 120 formed on the substrate 110, the polymer layer having a thickness of 5 to 50 μm; a conductive layer 130 formed on the polymer layer 120, the conductive layer having a thickness of 5 to 20 μm (this layer is identical to the conductive layer of the first preferred embodiment of the present invention, and will be hereinafter referred to as "a first conductive layer"); a polymer insulation layer 180 formed on the first conductive layer 130, the polymer insulation layer having a thickness of 5 to 50 μm; another conductive layer 190 formed on the polymer insulation layer 180, the conductive layer having a thickness of 5 to 20 μm (this layer will be hereinafter referred to as "a second conductive layer"); a dielectric layer 140 formed on the second conductive layer 190, the dielectric layer having a thickness of 3 to 25 μm; a phosphor layer 150 formed on the dielectric layer 140, the phosphor layer having a thickness of 30 to 50 μm; a transparent conductive layer 160 formed on the phosphor layer 150, the transparent conductive layer having a thickness of 1 to 10 μm; and a polymer protection layer 170 formed on the transparent conductive layer 160, the polymer protection layer having a thickness of 5 to 50 μm. As described above, the second preferred embodiment of the present invention is characterized in that the polymer insulation layer 180 and the second conductive layer 190 are disposed between the conductive layer 130 and the dielectric layer 140 of the flexible EL device according to the first preferred embodiment of the present invention while the second conductive layer 190 is placed on the polymer insulation layer 180.

The polymer insulation layer 180 may be made of polymer that does not react with various solvents after being hardened, and is hardened by infrared (IR) or ultraviolet (UV) irradiation. Alternatively, the polymer insulation layer may be made of binder including a fluorine compound-based highly polymerized material or polyurethane. The material for the second conductive layer 190 is the same as the material for the conductive layer 130 of the first preferred embodiment of the present invention.

Consequently, noise is prevented by simply changing the structure of the flexible EL device and adding the material layers, and therefore, electric and physical properties of the flexible EL device are improved.

EMBODIMENT 3

A flexible EL device according to a third preferred embodiment of the present invention is similar to the flexible EL device realized using the transparent or translucent substrate made of highly polymerized synthetic rubber, polyurethane, or silicon rubber according to the second preferred embodiment of the present invention except that the flexible EL device according to the third preferred embodiment of the present invention is built in a reverse sequence of the flexible EL device according to the second preferred embodiment of the present invention. Consequently, descriptions of the components of the flexible EL device according to the third preferred embodiment of the present invention corresponding to those of the flexible EL device according to the second preferred embodiment of the present invention will not be given.

Referring to FIG. 3, the reverse-structure flexible EL device according to the third preferred embodiment of the present invention comprises: a substrate 110 made of highly polymerized synthetic rubber, polyurethane, or silicon rubber, the substrate having a thickness of 0.05 to 2.00 mm; a polymer layer 120 formed on the substrate 110, the polymer layer having a thickness of 5 to 50 μm; a transparent conductive layer 160 formed on the polymer layer 120, the transparent conductive layer having a thickness of 1 to 10 μm; a phosphor layer 150 formed on the transparent conductive layer 160, the phosphor layer having a thickness of 30 to 50 µm; a dielectric layer 140 formed on the phosphor layer 150, the dielectric layer having a thickness of 3 to 25 µm; a second conductive layer 190 formed on the dielectric layer 140, the conductive layer having a thickness of 5 to 20 µm; a polymer insulation layer 180 formed on the second conductive layer 190, the polymer insulation layer having a thickness of 5 to 50 µm; a first conductive layer 130 formed on the polymer insulation layer 180, the first conductive layer having a thickness of 5 to 20 µm; and a polymer protection layer 170 formed on the first conductive layer 130, the polymer protection layer having a thickness of 5 to 50 µm.

According to the third preferred embodiment of the present invention with the above-stated construction, light is emitted through the substrate.

The reverse-structure flexible EL device according to the third preferred embodiment of the present invention is characterized by the polymer layer, the polymer insulation layer, and the two conductive layers, although the polymer layer, the polymer insulation layer, and the second conductive layer may be omitted as in the first preferred embodiment of the present invention. As described above, the polymer layer is provided to prevent permeation of moisture, and the polymer insulation layer and the second conductive layer are provided to prevent or reduce noise. Consequently, the reverse-structure flexible EL device according to the third preferred embodiment of the present invention may be realized without the polymer layer, the polymer insulation layer, and the second conductive layer.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

The invention claimed is:

1. A flexible EL device comprising:
   a substrate made of highly polymerized synthetic rubber, polyurethane, or silicon rubber;
   a conductive layer formed on the substrate;
   a dielectric layer formed on the conductive layer;
   a phosphor layer formed on the dielectric layer, the phosphor layer being composed of ZnS powder and a binder having a dielectric constant higher than that of the ZnS powder:
   a transparent conductive layer formed on the phosphor layer; and
   a polymer protection layer formed on the transparent conductive layer.

2. The device as set forth in claim 1, further comprising:
   a polymer layer disposed between the substrate and the conductive layer.

3. The device as set forth in claim 2, wherein the polymer layer has a thickness of 5 to 50 µm.

4. The device as set forth in claim 1, further comprising:
   a polymer insulation layer and a second conductive layer disposed between the conductive layer and the dielectric layer, the second conductive layer being formed on the polymer insulation layer.

5. The device as set forth in claim 4, wherein the polymer insulation layer has a thickness of 5 to 50 µm, and the second conductive layer has a thickness of 5 to 20 µm.

6. The device as set forth in claim 1, wherein the substrate has a thickness of 0.05 to 2.00 mm, the conductive layer has a thickness of 5 to 20 µm, the dielectric layer has a thickness of 3 to 25 µm, the phosphor layer has a thickness of 30 to 50 µm, the transparent conductive layer has a thickness of 1 to 10 µm, and the polymer protection layer has a thickness of 5 to 50 µm.

7. A flexible EL device comprising:
   a transparent or translucent substrate made of highly polymerized synthetic rubber, polyurethane, or silicon rubber;
   a transparent conductive layer formed on the substrate;
   a phosphor layer formed on the transparent conductive layer, the phosphor layer being composed of ZnS powder and a binder having a dielectric constant higher than that of the ZnS powder;
   a dielectric layer formed on the phosphor layer;
   a conductive layer formed on the dielectric layer; and
   a polymer protection layer formed on the conductive layer.

8. The device as set forth in claim 7, further comprising:
   a polymer layer disposed between the substrate and the transparent conductive layer.

9. The device as set forth in claim 8, further comprising:
   a second conductive layer and a polymer insulation layer disposed between the dielectric layer and the conductive layer, the polymer insulation layer being formed on the second conductive layer.

10. The device as set forth in claim 9, wherein the second conductive layer has a thickness of 5 to 20 µm, and the polymer insulation layer has a thickness of 5 to 50 µm.

* * * * *